United States Patent
Endisch et al.

[11] Patent Number: 6,140,254
[45] Date of Patent: Oct. 31, 2000

[54] EDGE BEAD REMOVAL FOR NANOPOROUS DIELECTRIC SILICA COATINGS

[75] Inventors: Denis H. Endisch, Cupertino; Hui-Jung Wu, Fremont, both of Calif.; Teresa Ramos, Albuquerque, N. Mex.

[73] Assignee: AlliedSignal Inc., Morristown, N.J.

[21] Appl. No.: 09/156,220

[22] Filed: Sep. 18, 1998

[51] Int. Cl.$^7$ .................................................. H01L 21/469
[52] U.S. Cl. .................... 438/787; 438/697; 438/704; 438/756; 438/761; 438/763; 438/790; 216/91; 216/38
[58] Field of Search .................... 438/697, 704, 438/756, 761, 763, 787, 790; 216/91, 38

[56] References Cited

U.S. PATENT DOCUMENTS

| | | | |
|---|---|---|---|
| 4,510,176 | 4/1985 | Cuthbert et al. | 427/82 |
| 4,732,785 | 3/1988 | Brewer | 427/240 |
| 5,955,140 | 9/1999 | Smith et al. | 427/96 |
| 6,022,812 | 9/1999 | Smith et al. | 438/761 |

FOREIGN PATENT DOCUMENTS 0775669  5/1997  European Pat. Off. .

*Primary Examiner*—David Nelms
*Assistant Examiner*—Quoc Hoang
*Attorney, Agent, or Firm*—Leslie A. Weise

[57] ABSTRACT

A process for forming a nanoporous dielectric silica coating on a surface of a substrate. The process includes spin-depositing alkoxysilane composition onto a surface of a substrate; spin depositing a surface hydrophobizing agent or a solvent onto an edge portion of the substrate to thereby remove the alkoxysilane composition from that area; and then curing the alkoxysilane composition to form a nanoporous dielectric silica coating. In another embodiment, an alkoxysilane composition layer is deposited onto a surface of a substrate. Then a solvent for the alkoxysilane substantially removes a portion of the alkoxysilane layer on the edge portion of the surface. This results in a transfer or cascading of a quantity of the alkoxysilane from a region adjacent to the edge portion to form a relatively thinner layer of the alkoxysilane onto the edge portion of the substrate surface. Then the relatively thinner alkoxysilane layer is removed prior to curing the alkoxysilane.

24 Claims, 3 Drawing Sheets

EDGE BEAD REMOVAL FOR NANOPOROUS DIELECTRIC SILICA COATINGS

BACKGROUND OF THE INVENTION

1. Field of the Invention

The present invention relates to the production of integrated circuits. More particularly, the invention relates to the removal of an edge bead of spun-on nanoporous dielectric silica coatings on substrates which are used in the production of integrated circuits.

2. Description of the Prior Art

In the production of integrated circuits, several methods have been developed to deposit a dielectric coating onto a substrate. One common method is spin-coating of dielectric compositions on such substrates. Spin-coating involves deposition of a liquid composition onto a spinning substrate to thereby uniformly coat a surface of the substrate. Spin-coating has been widely used in the formation of nanoporous dielectric silica coatings on substrates such as semiconductor substrates.

Nanoporous dielectric silica coatings can be formed by depositing a liquid alkoxysilane composition onto a spinning substrate to thereby coat the substrate. The coating is typically polymerized, condensed, and cured to form a nanoporous dielectric silica coating on the substrate.

In processes such as the manufacture of integrated circuits, a liquid coating on a spinning substrate tends to spread to the substrate edge, thereby forming an edge bead. Edge beads formed from brittle substances such as silica tend to shatter upon subsequent processing, especially when machinery comes in contact with the edge of the substrate. This leads to the generation of tiny particles which contaminate further processing of the integrated circuits. Ideally, a 3–5 mm wide area at the edge of a substrate should be free of coating material to avoid this particle contamination.

Various techniques are known in the art to remove the edge bead from the substrate during or after spinning. One method of edge bead removal (EBR) is by the use of solvents such as alcohols to dissolve the coating on the substrate's edge. However, since alkoxysilane compositions often contain low volatility solvents, they tend to remain liquid after deposition onto the substrate. If a solvent such as an alcohol is used to remove the edge bead, the wet alkoxysilane composition can still spread to the edge of the substrate, similar to ink spreading on wet paper. Preventing this further problem would require cleaning a wider edge area, thus reducing the usable surface area of the substrate.

U.S. Pat. No. 4,510,176 discloses a process for removing photoresist compositions from the edge of a semiconductor substrate. A stream of a solvent is first directed onto the edge of a spinning, photoresist coated semiconductor substrate. After the coating material is dissolved, a gas is discharged onto the spinning substrate to carry loose fluid and/or debris away from the center of the substrate. U.S. Pat. No. 4,732,785 discloses a process for edge bead removal of spun-on glass compositions. A stream of a solvent is directed onto the edge of a spinning substrate to thereby remove an edge bead which contains $SiO_2$. The substrate is spun at a first rotational speed and then a second lower rotational speed to thereby gradually remove the edge bead during deceleration.

It would be desirable to develop an edge bead removal method which results in the formation of a spin-coated nanoporous dielectric silica coating on a substrate with an uncoated edge. The present invention offers a solution to this problem. In one embodiment of the invention the deposition of a surface hydrophobizing agent, such as hexamethyldisilazane (HMDZ), onto a spinning substrate results in the clean removal of an alkoxysilane composition from a substrate edge. The surface hydrophobizing agent causes the substrate surface to become hydrophobic such that it repels alkoxysilanes and low volatility solvent materials in the edge areas. In another embodiment of the invention an edge bead can be cleanly removed by dispensing a solvent for the coating material onto the coated edge and spinning the substrate first at a relatively low speed and then at a relatively high speed to first partially remove and then substantially totally remove the composition from the edge of the substrate.

SUMMARY OF THE INVENTION

The invention provides a process for forming a nanoporous dielectric silica coating on a surface of a substrate which comprises conducting steps (a) and (b) in either order or simultaneously:

(a) spin depositing a partially hydrolyzed and partially condensed, fluid alkoxysilane composition onto a surface of a substrate, which alkoxysilane composition comprises at least one alkoxysilane, a solvent composition, optional water and an optional base;

(b) spin depositing a surface hydrophobizing agent onto an edge of the surface of the substrate; and (c) curing the alkoxysilane composition to a nanoporous dielectric silica coating.

The invention further provides a process for forming a nanoporous dielectric silica coating on a surface of a substrate which comprises:

(a) depositing a partially hydrolyzed, partially condensed, fluid alkoxysilane composition layer onto a surface of a substrate, which alkoxysilane composition comprises at least one alkoxysilane, a solvent composition, optional water and an optional base;

(b) spin depositing a solvent for the alkoxysilane composition onto a portion of the alkoxysilane composition layer at an edge portion of the substrate surface, to substantially remove the portion of the alkoxysilane composition layer on the edge portion of the substrate surface and transferring a quantity of the alkoxysilane composition from a region adjacent to the edge portion of the substrate surface to form a relatively thinner layer of the alkoxysilane composition onto the edge portion of the substrate surface;

(c) spin depositing a solvent for the alkoxysilane composition onto the relatively thinner alkoxysilane composition layer at an edge portion of the substrate surface, for a time sufficient to substantially remove the relatively thinner alkoxysilane composition layer on the edge portion of the substrate surface; and (d) curing the alkoxysilane composition to a nanoporous dielectric silica coating.

The invention still further provides a process for forming a nanoporous dielectric silica coating on a surface of a substrate which comprises:

(a) depositing a partially hydrolyzed, partially condensed, fluid alkoxysilane composition layer onto a surface of a substrate, which alkoxysilane composition comprises at least one alkoxysilane, a solvent composition, optional water and an optional base;

(b) spin depositing a solvent for the alkoxysilane composition onto a portion of the alkoxysilane composition layer at an edge portion of the substrate surface, which spin depositing is conducted at a first rotational speed and for a time sufficient to substantially remove the portion of the alkoxysilane composition layer on the edge portion of the substrate surface and transferring a quantity of the alkoxysilane composition from a region adjacent to the edge portion of the substrate surface to form a relatively thinner layer of the alkoxysilane composition onto the edge portion of the substrate surface;

(c) spin depositing a solvent for the alkoxysilane composition onto the relatively thinner alkoxysilane composition layer at an edge portion of the substrate surface, which spin depositing is conducted at a second rotational speed which is faster than the first rotational speed, for a time sufficient to substantially remove the relatively thinner alkoxysilane composition layer on the edge portion of the substrate surface; and (d) curing the alkoxysilane composition to a nanoporous dielectric silica coating.

The invention still further provides a process for forming a nanoporous dielectric silica coating on a surface of a substrate which comprises:

(a) depositing a partially hydrolyzed, partially condensed, fluid alkoxysilane composition layer onto a surface of a substrate, which alkoxysilane composition comprises at least one alkoxysilane, a solvent composition, optional water and an optional base;

(b) spin depositing a solvent for the alkoxysilane composition onto a portion of the alkoxysilane composition layer at an edge portion of the substrate surface, which spin depositing is conducted with a nozzle positioned at a first nozzle distance from the outer edge of the substrate, to substantially remove the portion of the alkoxysilane composition layer on the edge portion of the substrate surface and transfer a quantity of the alkoxysilane composition from a region adjacent to the edge portion of the substrate surface to form a relatively thinner layer of the alkoxysilane composition onto the edge portion of the substrate surface;

(c) spin depositing a solvent for the alkoxysilane composition onto the relatively thinner alkoxysilane composition layer at an edge portion of the substrate surface, which spin depositing is conducted with a nozzle at a second nozzle distance closer to the outer edge of the substrate, to substantially remove the relatively thinner alkoxysilane composition layer on the edge portion of the substrate surface; and (d) curing the alkoxysilane composition to a nanoporous dielectric silica coating.

The invention still further provides a coated substrate which comprises a circular substrate having an outermost circumferential edge and a nanoporous dielectric silica coating uniformly deposited on a surface of the substrate, which coating is absent from an edge portion around the circumference of the substrate.

DETAILED DESCRIPTION OF THE PREFERRED EMBODIMENT

According to the invention, a partially hydrolyzed and partially condensed alkoxysilane composition is formed from a blend of at least one alkoxysilane, a solvent composition, optional water, and an optional base. The alkoxysilane composition is deposited onto a spinning substrate having a top surface, an edge portion of the top surface, and an outer edge of the substrate, to thereby uniformly coat the top surface. The forces exerted on the spinning substrate may cause an amount of the alkoxysilane composition to coagulate on the edge portion of the substrate, forming an edge bead. According to the invention, the alkoxysilane is either removed or prevented from forming on the edge portion by the application of a surface hydrophobizing agent to the edge portion. The alkoxysilane composition is subsequently cured to form a nanoporous dielectric silica coating.

For purposes of this invention, the edge portion is an area on the top surface of the substrate which begins at the outer edge of the substrate and extends inward, preferably from about 1 to about 8 mm from the outer edge, more preferably from about 2 to about 6 mm from the outer edge, and most preferably from about 3 to about 5 mm from the outer edge. The best EBR width depends on wafer size and tool used for subsequent process. Larger EBR area leaves larger wafer area unusable, small EBR area does not permit particle free wafer handling.

Figure 1:
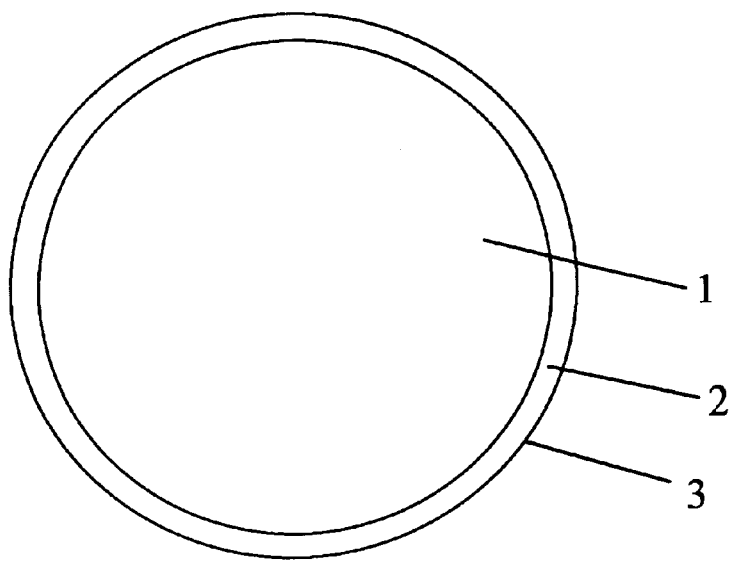
FIG. 1 shows a schematic top view representation of a coated substrate.

In one preferred embodiment, the surface hydrophobizing agent is deposited onto the edge portion prior to deposition of the alkoxysilane composition to thereby hydrophobize the top surface of the substrate, preventing subsequent adherence of the alkoxysilane composition to the substrate. This results in a substrate 2 of FIG. 1 which has a coated center area 1 and an uncoated edge portion 3.

In another embodiment, the surface hydrophobizing agent is deposited onto the edge portion after deposition of the alkoxysilane composition, to thereby dissolve and remove the deposited alkoxysilane composition.

In still another embodiment of the invention, the surface hydrophobizing agent and the alkoxysilane composition are simultaneously deposited onto the substrate, so that the alkoxysilane composition adheres to all parts of the substrate except the edge portion.

In another embodiment of the invention, an alkoxysilane is spin deposited onto the surface of a substrate. Then the alkoxysilane composition is removed from an edge portion of a substrate in two or more steps to first partially and then substantially remove the edge bead from the substrate.

Figure 2:
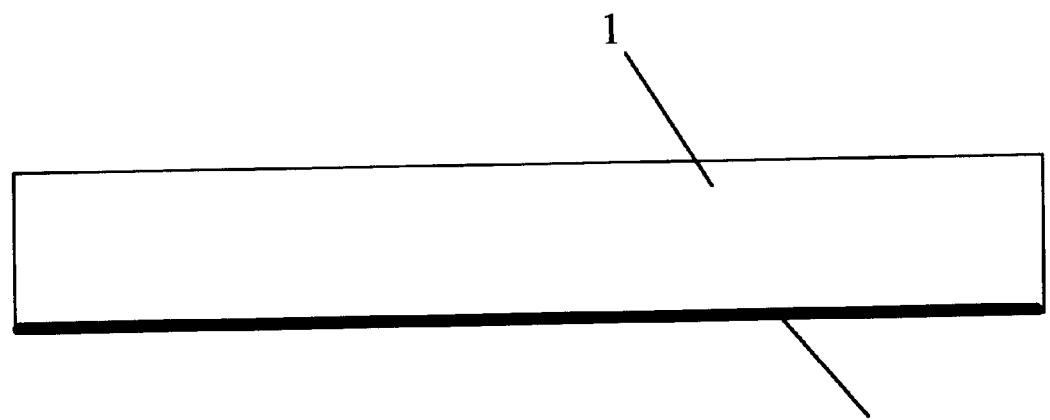
FIG. 2 shows a schematic representation of a cross-sectional side view of a coated substrate before removal of the edge bead.
Figure 3:
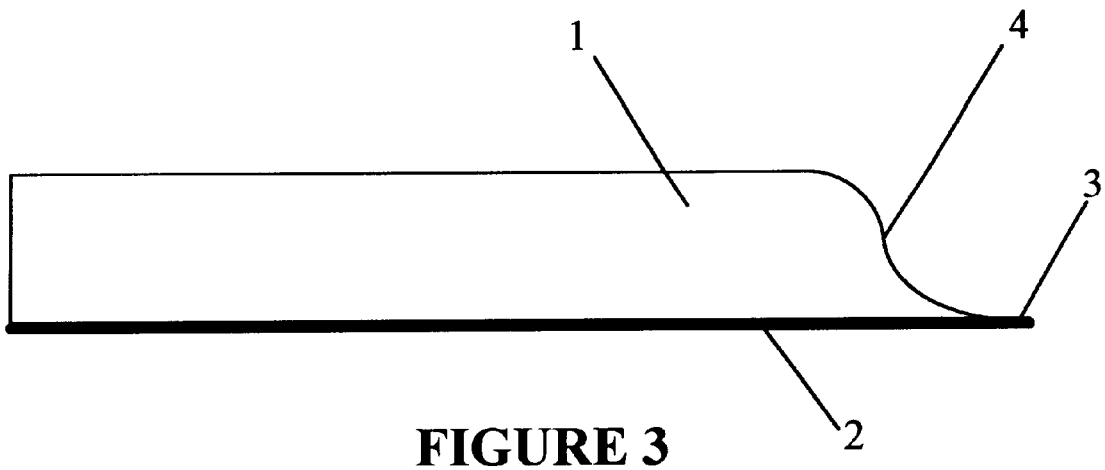
FIG. 3 shows a schematic representation of a cross-sectional side view of a coated substrate according to the invention where the edge bead has been partially removed from the edge portion and a quantity of the coating from a region adjacent to the edge portion has cascaded to form a relatively thinner layer of the coating on the edge portion of the substrate surface.
Figure 4:
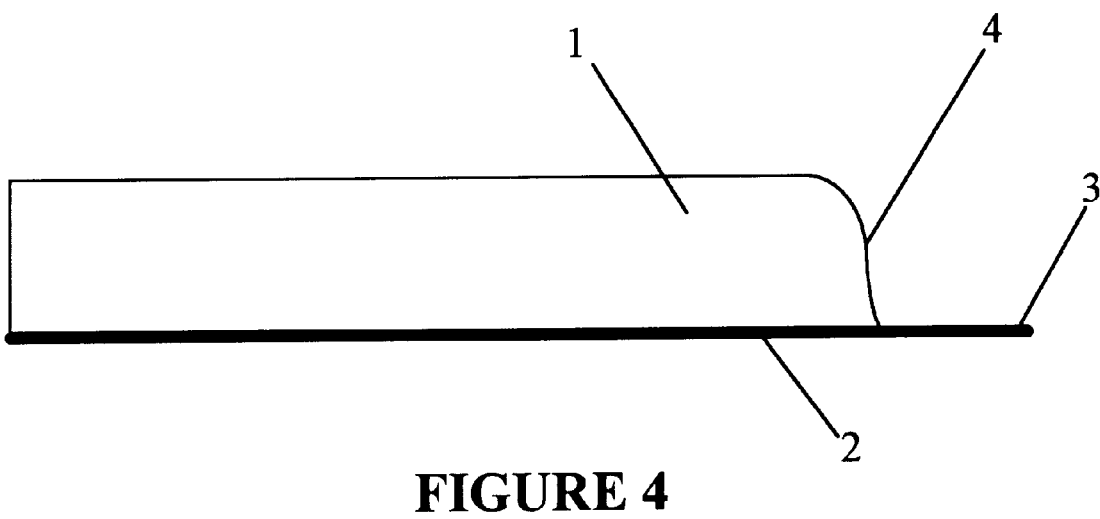
FIG. 4 shows a schematic representation of a cross-sectional side view of a coated substrate according to the invention where the cascaded thinner layer of the coating has been substantially totally removed from the edge portion.

According to this embodiment, a coated substrate is formed according to FIG. 2 where an alkoxysilane composition 1 is deposited onto a substrate 2. In FIGS. 2–6, the coating and substrate are not drawn to scale. In all cases, the substrate is much thicker than the coating. A solvent for the alkoxysilane is then deposited onto the edge portion, which results in a coated substrate as shown in FIG. 3. The wet alkoxysilane is removed from the edge portion 3 of the substrate 2 and the wet alkoxysilane from the area adjacent to the edge portion cascades down into the edge portion to form a relatively thinner layer 4 of the alkoxysilane composition 1 on the edge portion 3. As shown in FIG. 4, the edge portion 3 is then substantially completely removed of the relatively thinner layer of the alkoxysilane composition 1 from the edge portion.

The stepwise removal of the alkoxysilane can be done in a variety of ways. In one process, a solvent is spin-deposited onto an edge portion of a substrate to first partially and then substantially remove the edge bead from the substrate, where the substrate is spun at a first rotational speed and then a second rotational speed which is faster than the first rotational speed. The spin speed depends on the wafer size and surface tension of the material used. Larger diameters requires lower spin speed because the centrifugal force is proportional to the radius. The following spin speed numbers are typical for 200 mm diameter wafers. The numbers will scale for smaller or larger wafers. The first rotational speed preferably ranges from about 100 rpm to about 1000 rpm, more preferably from about 200 rpm to about 800 rpm, most preferably from about 400 rpm to about 600 rpm. The second rotational speed preferably ranges from about 500 rpm to about 3000 rpm, more preferably from about 800 rpm to about 2000 rpm, most preferably from about 1200 rpm to about 1800 rpm. Spin time at the first rotational speed is preferably from about 0.5 second to about 20 seconds, more preferably from about 1 second to about 5 seconds, and most preferably from about 1 second to about 3 seconds. Spin time at the second rotational speed is preferably from about 1 second to about 10 seconds, more preferably from about 2 seconds to about 8 seconds, and most preferably from about 3 seconds to about 6 seconds. Optionally a series of increasing speed rotations may be done. Separate solvent depositions may be done for each rotation period.

Figure 5:
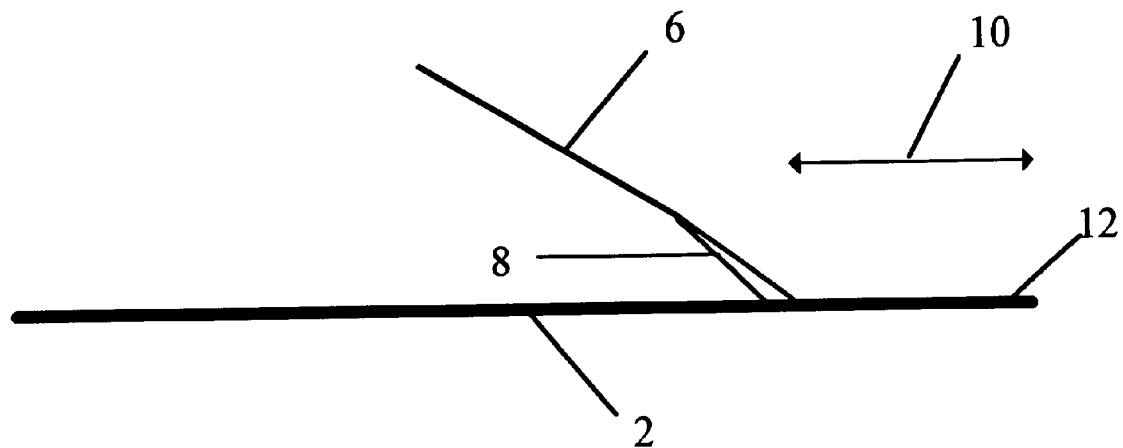
FIG. 5 shows a schematic representation of a cross-sectional side view of a substrate and a dispense nozzle.

In still another embodiment of the invention, a solvent is spin-deposited onto an edge portion of a substrate by through a nozzle to first partially and then substantially remove the edge bead from the substrate. The nozzle is positioned at a first nozzle distance from the outer edge of the substrate to partially remove the edge bead, and then at a second nozzle distance farther from the outer edge of the substrate to substantially remove the edge bead. This may be done with a single nozzle which is repositioned or with two or more fixed position nozzles. Nozzle distance refers to the distance between the solvent stream at the point where it reaches the substrate and the substrate edge (See FIG. 5). The first nozzle distance preferably ranges from about 3 mm to about 8 mm from the outer edge of the substrate, more preferably from about 4 mm to about 7 mm from the outer edge of the substrate, and most preferably from about 5 mm to about 6 mm from the outer edge of the substrate. The second nozzle distance preferably ranges from about 1 mm to about 6 mm from the outer edge of the substrate, more preferably from about 4 mm to about 7 mm from the outer edge of the substrate, and most preferably from about 5 mm to about 6 mm from the outer edge of the substrate. More nozzles may be positioned closer to the outer edge in serial fashion. FIG. 5 is a schematic representation of a cross-sectional side view of a substrate and a dispense nozzle. Dispense nozzle 6 directs a solvent stream 8 to a substrate. The edge region 12 of the substrate 2 extends for a distance 10 between solvent stream and edge of the wafer.

The alkoxysilane composition is formed from a blend of at least one alkoxysilane, a solvent composition, optional water, and an optional base. Useful alkoxysilanes for this invention include those which have the formula:

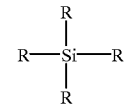

wherein at least 2 of the R groups are independently $C_1$ to $C_4$ alkoxy groups and the balance, if any, are independently selected from the group consisting of hydrogen, alkyl, phenyl, halogen, substituted phenyl. For purposes of this invention, the term alkoxy includes any other organic group which can be readily cleaved from silicon at temperatures near room temperature by hydrolysis. R groups can be ethylene glycoxy or propylene glycoxy or the like, but preferably all four R groups are methoxy, ethoxy, propoxy or butoxy. The most preferred alkoxysilanes nonexclusively include tetraethoxysilane (TEOS) and tetramethoxysilane.

The alkoxysilane component is preferably present in an amount of from about 3% to about 50% by weight of the overall blend, more preferably from about 5% to about 45% and most preferably from about 10% to about 40%.

Preferably, the solvent composition for the alkoxysilane composition comprises a relatively high volatility solvent or a relatively low volatility solvent or both a relatively high volatility solvent and a relatively low volatility solvent. The solvent, usually the higher volatility solvent, is at least partially evaporated immediately after deposition onto the substrate. This partial drying leads to better planarity due to the lower viscosity of the material after the first solvent or parts of the solvent comes off. The more volatile solvent evaporates over a period of seconds or minutes. Slightly elevated temperatures may optionally be employed to accelerate this step. Such temperatures preferably range from about 20° C. to about 80° C., more preferably from about 20° C. to about 50° C. and most preferably from about 20° C. to about 35° C.

For purposes of this invention, a relatively high volatility solvent is one which evaporates at a temperature below, preferably significantly below, that of the relatively low volatility solvent. The relatively high volatility solvent preferably has a boiling point of about 120° C. or less, more preferably about 100° C. or less. Suitable high volatility solvents nonexclusively include methanol, ethanol, n-propanol, isopropanol, n-butanol and mixtures thereof. Other relatively high volatility solvents which are compatible with the other ingredients can be readily determined by those skilled in the art.

The relatively low volatility solvent is one which evaporates at a temperature above, preferably significantly above, that of the relatively high volatility solvent. The relatively low volatility solvent preferably has a boiling point of about 175° C. or higher, more preferably about 200° C. or higher. Suitable low volatility solvents nonexclusively include alcohols and polyols including glycols such as ethylene glycol, 1,4-butylene glycol, 1,5-pentanediol, 1,2,4-butanetriol, 1,2, 3-butanetriol, 2-methyl-propanetriol, 2-(hydroxymethyl)-1, 3-propanediol, 1,4,1,4-butanediol, 2-methyl-1,3-propanediol, tetraethylene glycol, triethylene glycol monomethyl ether, glycerol and mixtures thereof. Other relatively low volatility solvents which are compatible with the other ingredients can be readily determined by those skilled in the art.

The solvent in the alkoxysilane composition is preferably present in an amount of from about 10% to about 90% by weight of the overall blend, more preferably from about 15% to about 80% and most preferably from about 40% to about 60%. When both a high and a low volatility solvent are present, the high volatility solvent component is preferably present in an amount of from about 20% to about 90% by weight of the overall blend, more preferably from about 30% to about 70% and a most preferably from about 40% to about 60% by weight of the overall blend. When both a high and a low volatility solvent are present, the low volatility solvent component is preferably present in an amount of from about 1 to about 40% by weight of the overall blend, more preferably from about 3% to about 30% and a most preferably from about 5% to about 20% by weight of the overall blend.

Water is included to provide a medium for hydrolyzing the alkoxysilane. The mole ratio of water to silane is preferably from about 0 to about 50, more preferably from about 0.1 to about 10 and a most preferably from about 0.5 to about 1.5. In the preferred embodiment, the temperature of the water during the exposure preferably ranges from about 10° C. to about 60° C., more preferably from about 15° C. to about 50° C., and most preferably from about 20° C. to about 40° C.

The base may be present in a catalytic amount which can be readily determined by those skilled in the art. Preferably the molar ratio of base to silane ranges from about 0 to about 0.2, more preferably from about 0.001 to about 0.05, and most preferably from about 0.005 to about 0.02. In the preferred embodiment, the temperature of the base during the exposure preferably ranges from about 10° C. to about 60° C., more preferably from about 15° C. to about 40° C., and most preferably from about 20° C. to about 30° C.

Suitable bases nonexclusively include ammonia and amines, such as primary, secondary and tertiary alkyl amines, aryl amines, alcohol amines and mixtures thereof which have a preferred boiling point of at least about −50° C., more preferably at least about 50° C., and most preferably at least about 150° C. Preferred amines are alcohol amines, alkylamines, methylamine, dimethylamine, trimethylamine, n-butylamine, n-propylamine, tetramethyl ammonium hydroxide, piperidine, 2-methoxyethylamine, mono-, di- or triethanolamines, and mono-, di-, or triisopropanolamines.

The ability of an amine to accept a proton in water is measured in terms of the basicity constant $K_b$, and $pK_b=-\log K_b$. In the preferred embodiment, the $pK_b$ of the base may range from about less than 0 to about 9, more preferably from about 2 to about 6 and most preferably from about 4 to about 5.

Suitable solvents for edge bead removal include any solvent that can dissolve the alkoxysilane composition. Preferred solvents for edge bead removal include the high volatility solvents listed above.

Suitable surface hydrophobizing agents include compounds which have a formula selected from the group consisting of: $R_3SiNHSiR_3$, $R_xSiCl_y$, $R_xSi(OH)_y$, $R_3SiOSiR_3$, $R_xSi(OR)_y$, $M_pSi(OH)_{[4-p]}$, $R_xSi(OCOCH_3)_y$ and combinations thereof, wherein x is an integer ranging from 1 to 3, y is an integer ranging from 1 to 3 such that y=4−x, p is an integer ranging from 2 to 3; each R is an independently selected from hydrogen and a hydrophobic organic moiety; each M is an independently selected hydrophobic organic moiety; and R and M can be the same or different. The R and M groups are preferably independently selected from the group of organic moieties consisting of alkyl, aryl and combinations thereof. The alkyl moiety is substituted or unsubstituted and is selected from the group consisting of straight alkyl, branched alkyl, cyclic alkyl and combinations thereof, and wherein said alkyl moiety ranges in size from $C_1$ to about $C_{18}$. The aryl moiety is substituted or unsubstituted and ranges in size from $C_5$ to about $C_{18}$.

Preferred surface hydrophobizing agents include, but are not limited to, acetoxytrimethylsilane, acetoxysilane, diacetoxydimethylsilane, methyltriacetoxysilane, phenyltriacetoxysilane, diphenyldiacetoxysilane, trimethylethoxysilane, trimethylmethoxysilane, 2-trimethylsiloxypent-2-ene-4-one, n-(trimethylsilyl) acetamide, 2-(trimethylsilyl) acetic acid, n-(trimethylsilyl) imidazole, trimethylsilylpropiolate, trimethylsilyl (trimethylsiloxy)-acetate, nonamethyltrisilazane, hexamethyldisilazane(HMDZ), trimethylchlorosilane (TMCS), hexaphenyldisilazane, trifluoropropyldimethylchlorosilane, hexamethyldisiloxane, trimethylsilanol, triethylsilanol, triphenylsilanol, t-butyldimethylsilanol, diphenylsilanediol and combinations thereof. Most preferably the surface hydrophobizing agent is hexamethyldisilazane (HMDZ). The surface hydrophobizing agent may be mixed with suitable solvents such as alcohols or ketones, such as acetone, applied to the surface of a nanoporous dielectric silica coating in the form of a vapor or liquid, and then dried.

The alkoxysilane composition may be cured, aged, or dried in a conventional way such as evaporation of the less volatile solvent. Elevated temperatures may be employed to cure, age or dry the composition. Such temperatures preferably range from about 20° C. to about 450° C., more preferably from about 50° C. to about 350° C. and most preferably from about 175° C. to about 320° C. For purposes of the present invention, the term curing refers to the polymerization or condensation of the alkoxysilane composition onto the substrate after deposition and exposure to water and/or base.

As a result, a relatively high porosity, low dielectric constant nanoporous dielectric silica coating is formed on the substrate. The coating preferably has a dielectric constant of from about 1.1 to about 3.5, more preferably from about 1.3 to about 3.0, and most preferably from about 1.5 to about 2.5. The pore size of the nanoporous dielectric silica coating preferably ranges from about 1 nm to about 100 nm, more preferably from about 2 nm to about 30 nm, and most preferably from about 3 nm to about 20 nm. The density of the coating, including the pores, preferably ranges from about 0.1 to about 1.9 g/cm$^2$, more preferably from about 0.25 to about 1.6 g/cm$^2$, and most preferably from about 0.4 to about 1.2 g/cm$^2$.

Typical substrates are those suitable to be processed into an integrated circuit or other microelectronic device. Suitable substrates for the present invention non-exclusively include semiconductor materials such as gallium arsenide (GaAs), silicon and compositions containing silicon such as crystalline silicon, polysilicon, amorphous silicon, epitaxial silicon, and silicon dioxide (SiO$_2$) and mixtures thereof. Lines may optionally be on the substrate surface. The lines, when present, are typically formed by well known lithographic techniques and may be composed of a metal, an oxide, a nitride or an oxynitride. Suitable materials for the lines include silica, silicon nitride, titanium nitride, tantalum nitride, aluminum, aluminum alloys, copper, copper alloys, tantalum, tungsten and silicon oxynitride. These lines form the conductors or insulators of an integrated circuit. Such are typically closely separated from one another at distances preferably of from about 20 micrometers or less, more preferably from about 1 micrometer or less, and most preferably of from about 0.05 to about 1 micrometer.

The following non-limiting examples serve to illustrate the invention.

EXAMPLE 1

Pre-treatment of a wafer edge region with hexamethyldisilazane (HMDZ)/Acetone before precursor deposition.

A 100 mm diameter silicon wafer was spun at 2500 rpm using Solitec spin coater. A 50/50 (by vol.) mixture of hexamethyldisilazane and acetone was dispensed on a 2–5 mm wide region near the edge of the spinning wafer using a wash bottle with narrow dispense tip.

The total dispense time was about 10 seconds. The total dispense volume was about 10 ml to 30 ml. After the dispense was stopped, the wafer was spin dried for 10–20 seconds at 2500 rpm. Approximately 2–3 ml of precursor solution was deposited on the center of the stopped wafer using a pipette. The precursor was synthesized by adding 94.0 ml of tetraethoxysilane, 61.0 ml of triethyleneglycol monomethylether (TriEGMME), 7.28 ml of deionized water, and 0.31 ml of 1N nitric acid together in a round bottom flask. The solution was allowed to mix vigorously then heated to ~80° C. and refluxed for 1.5 hours to form a solution. After the solution was allowed to cool, it was stored in refrigeration at 4° C. After the solution was allowed to cool, it was diluted 30% by weight with ethanol to reduce the viscosity. The diluted precursor was filtered to 0.1 micrometer using a teflon filter. Within 0–3 seconds after precursor dispense on the wafer, the wafer was spun at 2500 rpm for 30 seconds. At the end of the spin process a 2–5 mm wide region near the wafer edge was free of spin-on material.

Figure 6:
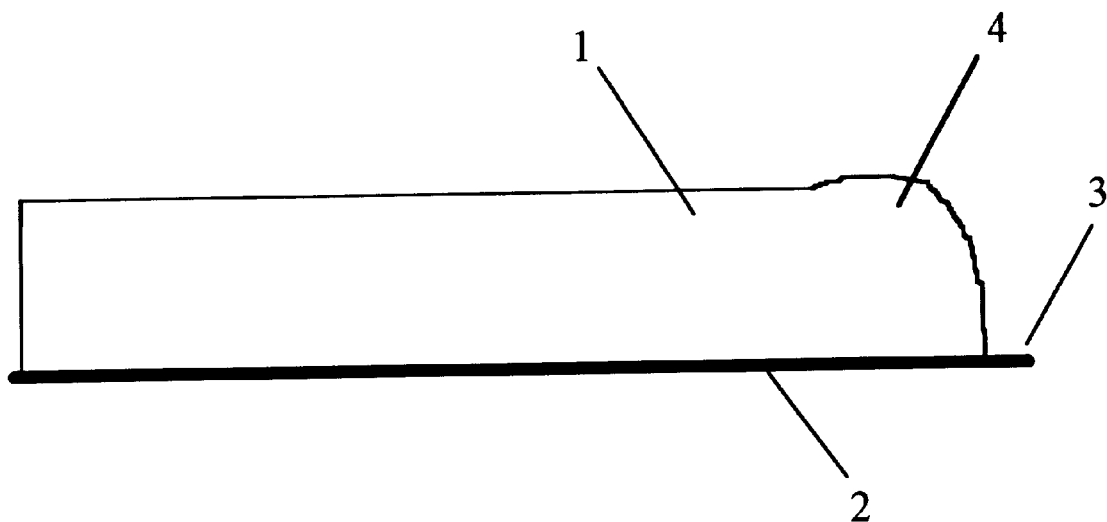
FIG. 6 shows a schematic representation of a cross-sectional side view of a coated substrate using a hydrophobic surface treatment of the EBR region before film deposition

The film was gelled and aged in a petri dish (diameter about 125 mm). The following conditions were used: 10–30 seconds before the end of the spin process about 5 to 10 drops (about 2–3 ml) of 15 M ammonium hydroxide were put on the bottom of the petri dish using a pipette. The silicon wafer was placed face up in the petri dish within 60 seconds after the end of the spin process. 5–10 mm thick spacers were placed under the wafer to avoid direct contact with the ammonium hydroxide drops. The petri dish was then closed for 10 minutes. After the end of the aging process the wafer was solvent exchanged. The wafer was returned to the spin coater and spun at about 500 rpm for 15 seconds. During this time a 50/50 (by vol.) mixture of hexamethyldisilazane and acetone was dispensed on the center of the rotating wafer using a wash bottle with narrow dispense tip. The total dispense time was about 10 seconds. The total dispense volume was about 10 to 30 ml. After the dispense was stopped, the wafer was spin dried for 10–20 seconds at 2500 rpm. The films were then heated at elevated temperatures for 1 minute each at 175° C. and 320° C. in air. Film thickness measurements using a single wavelength (633 nm), multi-angle ellipsometer showed a film thickness of about 10000 Å and a refractive index of about 1.11. Visual inspection of the wafer showed a 3–5 mm wide clear region near the edge of the wafer without any nanoporous silica material. A 1–3 mm wide region adjacent to the clear region showed an increased film thickness, because liquid precursor had been pushed back to this region. FIG. 6 shows a schematic representation of a cross-sectional side view of a coated substrate using a hydrophobic surface treatment of the EBR region before film deposition. A nanoporous silica film 1 is formed on a substrate 2. The edge 3 of wafer 2 has the film removed while the film region 4 shows a pushed back region of nanoporous silica film.

EXAMPLE 2

Treatment of a wafer edge region with HMDZ/Acetone after precursor deposition.

A precursor was synthesized by adding 94.0 ml of tetraethoxysilane, 61.0 ml of TriEGMME, 7.28 ml of deionized water, and 0.31 ml of 1N nitric acid together in a round bottom flask. The solution was allowed to mix vigorously then heated to ~80° C. and refluxed for 1.5 hours to form a solution. After the solution was allowed to cool, it was stored in refrigeration at 4° C. After the solution was allowed to cool, it was diluted 30% by weight with ethanol to reduce the viscosity. The diluted precursor was filtered to 0.1 micrometer using a teflon filter. A 100 mm diameter silicon wafer was placed on the spin chuck of a Solitec spin coater. Approximately 2–3 ml of precursor solution was deposited on the center of the resting wafer using a pipette. Within 0–3 seconds after precursor dispense on the wafer, the wafer was spun at 2500 rpm for 30 seconds. During the last 10–15 seconds of the 2500 rpm spin process a 50/50 (by vol.) mixture of hexamethyldisilazane and acetone was dispensed on a 2–5 mm wide region near the edge of the spinning wafer using a wash bottle with narrow dispense tip. The total dispense time was about 10 seconds. The total dispense volume was about 10 to 30 ml. The dispense was stopped 1–3 seconds before the end of the 2500 rpm spin process. At the end of the spin process a 2–5 mm wide region near the wafer edge was free of spin-on material. The film was gelled and aged in a petri dish (diameter about 125 mm). The following conditions were used: 10–30 seconds before the end of the spin process about 5 to 10 drops (about 2–3 ml) of 15. M ammonium hydroxide were put on the bottom of the petri dish using a pipette. The silicon wafer was placed face up in the petri dish within 60 seconds after the end of the spin process. 5–10 mm thick spacers were placed under the wafer to avoid direct contact with the ammonium hydroxide drops. The petri dish was then closed for 10 min. After the end of the aging process the wafer was solvent exchanged. The wafer was returned to the spin coater and spun at about 500 rpm for 15 seconds. During this time a 50/50 (by vol.) mixture of hexamethyldisilazane and acetone was dispensed on the center of the rotating wafer using a wash bottle with narrow dispense tip. The total dispense time was about 10 seconds. The total dispense volume was about 10 to 30 ml. After the dispense was stopped, the wafer was spin dried for 10–20 seconds at 2500 rpm. The films were then heated at elevated temperatures for 1 minute each at 175° C. and 320° C. in air.

Film thickness measurements using a single wavelength (633 nm), multi-angle ellipsometer showed a film thickness of about 10000 Å and a refractive index of about 1.11. Visual inspection of the wafer showed a 3–5 mm wide clear region near the edge of the wafer without any nanoporous silica material. A 1–2 mm wide region adjacent to the clear region showed an increased film thickness, because liquid precursor had been pushed back to this region. (See FIG. 6). The width and height of the edge region appeared smaller than in Example 1.

EXAMPLE 3

Edge bead removal using two different rotational speeds.

The precursor was synthesized by adding 104.0 ml of tetraethoxysilane, 51.0 ml of TriEGMME, 8.4 ml of deionized water, and 0.34 ml of 1N nitric acid together in a round bottom flask. The solution was allowed to mix vigorously then heated to ~80° C. and refluxed for 1.5 hours to form a solution. After the solution was allowed to cool, it was stored in refrigeration at 4° C. After the solution was allowed to cool, it was diluted 25% by weight with ethanol to reduce the viscosity. The diluted precursor was filtered to 0.1 micrometer using a teflon filter. Deposition was performed using a commercial spin (Dai Nippon Screen D-Spin 80A). A 200 mm diameter silicon wafer was used as substrate. The spin process is shown in Table 1. During step 2 approximately 5 ml of sor solution was deposited on the center of the wafer at 500 rpm for 3 seconds. During steps 4 and 5 the edge bead removal solvent propylene glycol methyl ether acetate (PGMEA), boiling point 145–146° C., was dispensed on a 3–5 mm wide region close to the edge of the wafers.

TABLE 1

Spin process

| Process step | Rotational speed [rpm] | Time between steps [sec] | Duration [sec] | Dispense | Description |
|---|---|---|---|---|---|
| 1 | 0 | 0.01 | 2 | IPA cup rinse solvent | Cup rinse |
| 2 | 500 | 0.01 | 3 | Precursor | Precursor deposition |
| 3 | 2500 | 0.01 | 30 | — | spin dry |
| 4 | 500 | 0.01 | 1 | EBR solvent (PGMEA) | edge bead removal, wider region |
| 5 | 1500 | 0.01 | 4 | EBR solvent (PGMEA) | edge bead removal, smaller region |
| 6 | 1000 | 0.01 | 1 | — | dry EBR solvent |
| 7 | 500 | 0.01 | 10 | — | dry EBR solvent |

At the end of the spin process a 2–5 mm wide region near the wafer edge was free of spin-on material. The film was gelled and aged in a vacuum chamber using the following conditions: The wafer was placed in the chamber was evacuated to −20 "Hg. Next, 15M ammonium hydroxide, which had been heated and equilibrated at 45° C. before the start of the process, was dosed into the chamber to increase the pressure to −4.0 inches of Hg. The wafer was kept in the chamber for 4 minutes, counting from the start of the introduction of the ammonium hydroxide. Finally, the chamber was evacuated to −20.0 "Hg and backfilled with nitrogen. After the end of the aging process the wafer was solvent exchanged. The water was returned to the spin coater and spun at about 500 rpm for 11 seconds. During this time a 50/50 (by vol.) mixture of hexamethyldisilazane and acetone was dispensed on the center of the rotating wafer. The total dispense time was 11 seconds. The total dispense volume was about 40 to 50 ml. After the dispense was stopped, the wafer was spin dried for 20 seconds at 2500 rpm. The films were then heated at elevated temperatures for 1 minute each at 175° C. and 320° C. in air. Film thickness measurements using a single wavelength (633 nm), multi-angle ellipsometer showed a film thickness of about 9000 Å and a refractive index of about 1.14. Visual inspection of the wafer showed a 3–5 mm wide clear region near the edge of the wafer without any nanoporous silica material. A 1–2 mm wide region adjacent to the clear region showed a transition region with gradually decreasing thickness.

What is claimed is:

1. A process for forming a nanoporous dielectric silica coating on a surface of a substrate which comprises conducting steps (a) and (b) in either order or simultaneously:
   (a) spin depositing a partially hydrolyzed and partially condensed, fluid alkoxysilane composition onto a surface of a substrate, which alkoxysilane composition comprises at least one alkoxysilane, a solvent composition, optional water and an optional base;
   (b) spin depositing a surface hydrophobizing agent onto an edge of the surface of the substrate; and
   (c) curing the alkoxysilane composition to a nanoporous dielectric silica coating.

2. The process of claim 1 wherein step (a) is conducted before step (b).

3. The process of claim 1 wherein step (b) is conducted before step (a).

4. The process of claim 1 wherein step (a) and step (b) are conducted simultaneously.

5. The process of claim 1 wherein the surface hydrophobizing agent comprises a material selected from the group consisting of hexamethyldisilazane, trimethylchlorosilane, hexaphenyldisilazane, triethylsilanol, trifluoropropyldimethylchlorosilane, and mixtures thereof.

6. The process of claim 1 wherein the surface hydrophobizing agent comprises hexamethyldisilazane.

7. The process of claim 1 wherein the surface hydrophobizing agent comprises a solvent for the alkoxysilane composition.

8. The process of claim 1 wherein the substrate is a semiconductor material.

9. The process of claim 8 wherein the semiconductor material is selected from the group consisting of gallium arsenide, silicon, crystalline silicon, polysilicon, amorphous silicon, epitaxial silicon, and silicon dioxide and mixtures thereof.

10. The coated semiconductor substrate produced according to the process of claim 8.

11. The process of claim 1 wherein the surface of the substrate comprises lines composed of metal, oxides, nitrides or oxynitrides.

12. The process of claim 11 wherein the lines are composed of a material selected from the group consisting of silica, silicon nitride, titanium nitride, tantalum nitride, aluminum, aluminum alloys, copper, copper alloys, tantalum, tungsten and silicon oxynitride.

13. The coated substrate produced according to the process of claim 1.

14. The process of claim 1 wherein the fluid alkoxysilane composition is substantially completely removed from the edge portion of the substrate by the surface hydrophobizing agent and not removed from the center portion of the substrate.

15. The process of claim 1 wherein the surface hydrophobizing agent prevents the alkoxysilane composition from forming on the edge portion of the substrate.

16. A process for forming a nanoporous dielectric silica coating on a surface of a substrate which comprises:
   (a) depositing a partially hydrolyzed, partially condensed, fluid alkoxysilane composition layer onto a surface of a substrate, which alkoxysilane composition comprises at least one alkoxysilane, a solvent composition, optional water and an optional base;
   (b) spin depositing a solvent for the alkoxysilane composition onto a portion of the alkoxysilane composition layer at an edge portion of the substrate surface, to substantially remove the portion of the alkoxysilane composition layer on the edge portion of the substrate surface and transferring a quantity of the alkoxysilane composition from a region adjacent to the edge portion of the substrate surface to form a relatively thinner layer of the alkoxysilane composition onto the edge portion of the substrate surface;
   (c) spin depositing a solvent for the alkoxysilane composition onto the relatively thinner alkoxysilane composition layer at an edge portion of the substrate surface, for a time sufficient to substantially remove the relatively thinner alkoxysilane composition layer on the edge portion of the substrate surface; and (d) curing the alkoxysilane composition to a nanoporous dielectric silica coating.

17. The process of claim 16 wherein the solvent has a boiling point of about 120° C. or less.

18. The process of claim 16 wherein the spin depositing of step (b) is conducted at a first rotational speed and wherein the spin depositing of step (c) is conducted at a second rotational speed which is faster than the first rotational speed.

19. The process of claim 16 wherein the spin depositing of step (b) is conducted with a nozzle positioned at a first nozzle distance from an outer edge the substrate and wherein the spin depositing of step (c) is conducted with a nozzle at a second nozzle distance closer to the outer edge of the substrate.

20. The coated substrate produced according to the process of claim 16.

21. A process for forming a nanoporous dielectric silica coating on a surface of a substrate which comprises:

(a) depositing a partially hydrolyzed, partially condensed, fluid alkoxysilane composition layer onto a surface of a substrate, which alkoxysilane composition comprises at least one alkoxysilane, a solvent composition, optional water and an optional base;

(b) spin depositing a solvent for the alkoxysilane composition onto a portion of the alkoxysilane composition layer at an edge portion of the substrate surface, which spin depositing is conducted at a first rotational speed and for a time sufficient to substantially remove the portion of the alkoxysilane composition layer on the edge portion of the substrate surface and transferring a quantity of the alkoxysilane composition from a region adjacent to the edge portion of the substrate surface to form a relatively thinner layer of the alkoxysilane composition onto the edge portion of the substrate surface;

(c) spin depositing a solvent for the alkoxysilane composition onto the relatively thinner alkoxysilane composition layer at an edge portion of the substrate surface, which spin depositing is conducted at a second rotational speed which is faster than the first rotational speed, for a time sufficient to substantially remove the relatively thinner alkoxysilane composition layer on the edge portion of the substrate surface; and (d) curing the alkoxysilane composition to a nanoporous dielectric silica coating.

22. The coated substrate produced according to the process of claim 21.

23. A process for forming a nanoporous dielectric silica coating on a surface of a substrate which comprises:

(a) depositing a partially hydrolyzed, partially condensed, fluid alkoxysilane composition layer onto a surface of a substrate, which alkoxysilane composition comprises at least one alkoxysilane, a solvent composition, optional water and an optional base;

(b) spin depositing a solvent for the alkoxysilane composition onto a portion of the alkoxysilane composition layer at an edge portion of the substrate surface, which spin depositing is conducted with a nozzle positioned at a first nozzle distance from the outer edge of the substrate, to substantially remove the portion of the alkoxysilane composition layer on the edge portion of the substrate surface and transfer a quantity of the alkoxysilane composition from a region adjacent to the edge portion of the substrate surface to form a relatively thinner layer of the alkoxysilane composition onto the edge portion of the substrate surface;

(c) spin depositing a solvent for the alkoxysilane composition onto the relatively thinner alkoxysilane composition layer at an edge portion of the substrate surface, which spin depositing is conducted with a nozzle at a second nozzle distance closer to the outer edge of the substrate, to substantially remove the relatively thinner alkoxysilane composition layer on the edge portion of the substrate surface; and (d) curing the alkoxysilane composition to a nanoporous dielectric silica coating.

24. The coated substrate produced according to the process of claim 23.

* * * * *